US011507300B2

(12) United States Patent
Miller et al.

(10) Patent No.: US 11,507,300 B2
(45) Date of Patent: Nov. 22, 2022

(54) WORD LINE GROUP READ COUNTERS

(71) Applicant: Micron Technology, Inc., Boise, ID (US)

(72) Inventors: Michael G. Miller, Boise, ID (US); Ashutosh Malshe, Fremont, CA (US); Gianni Stephen Alsasua, Rancho Cordova, CA (US); Renato Padilla, Jr., Folsom, CA (US); Vamsi Pavan Rayaprolu, San Jose, CA (US); Kishore Kumar Muchherla, Fremont, CA (US); Harish Reddy Singidi, Fremont, CA (US)

(73) Assignee: Micron Technology, Inc., Boise, ID (US)

(*) Notice: Subject to any disclaimer, the term of this patent is extended or adjusted under 35 U.S.C. 154(b) by 96 days.

(21) Appl. No.: 17/080,567

(22) Filed: Oct. 26, 2020

(65) Prior Publication Data

US 2022/0129187 A1  Apr. 28, 2022

(51) Int. Cl.
| | |
|---|---|
| *G11C 16/26* | (2006.01) |
| *G06F 3/06* | (2006.01) |
| *G06F 11/07* | (2006.01) |
| *G11C 16/34* | (2006.01) |
| *G11C 16/04* | (2006.01) |

(52) U.S. Cl.
CPC .......... *G06F 3/0655* (2013.01); *G06F 3/0604* (2013.01); *G06F 3/0679* (2013.01); *G06F 11/076* (2013.01); *G06F 11/0727* (2013.01); *G06F 11/0793* (2013.01); *G11C 16/26* (2013.01); *G11C 16/3427* (2013.01); *G11C 16/0483* (2013.01)

(58) Field of Classification Search
None
See application file for complete search history.

(56) References Cited

U.S. PATENT DOCUMENTS

| | | | |
|---|---|---|---|
| 2014/0136883 A1* | 5/2014 | Cohen .................. | G11C 16/349 714/6.11 |
| 2017/0262197 A1* | 9/2017 | Tan ........................ | G06F 3/0688 |

\* cited by examiner

*Primary Examiner* — Elias Mamo
(74) *Attorney, Agent, or Firm* — Schwegman Lundberg & Woessner, P.A.

(57) ABSTRACT

A processing device detects a read operation at a memory device that is directed at a word line group from among multiple word line groups of the memory device. The processing device increments a read counter associated with the word line group based on the read operation being directed at the word line group. The processing device determines the read counter exceeds a read-disturb threshold and performs read-disturb handling on the word line group in response to determining the read counter exceeds the read-disturb threshold.

20 Claims, 6 Drawing Sheets

WORD LINE GROUP READ COUNTERS

TECHNICAL FIELD

Embodiments of the disclosure relate generally to memory sub-systems and, more specifically, to read-disturb management techniques that include maintaining counters for reads per word line group in a memory sub-system.

BACKGROUND

A memory sub-system can include one or more memory devices that store data. The memory components can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
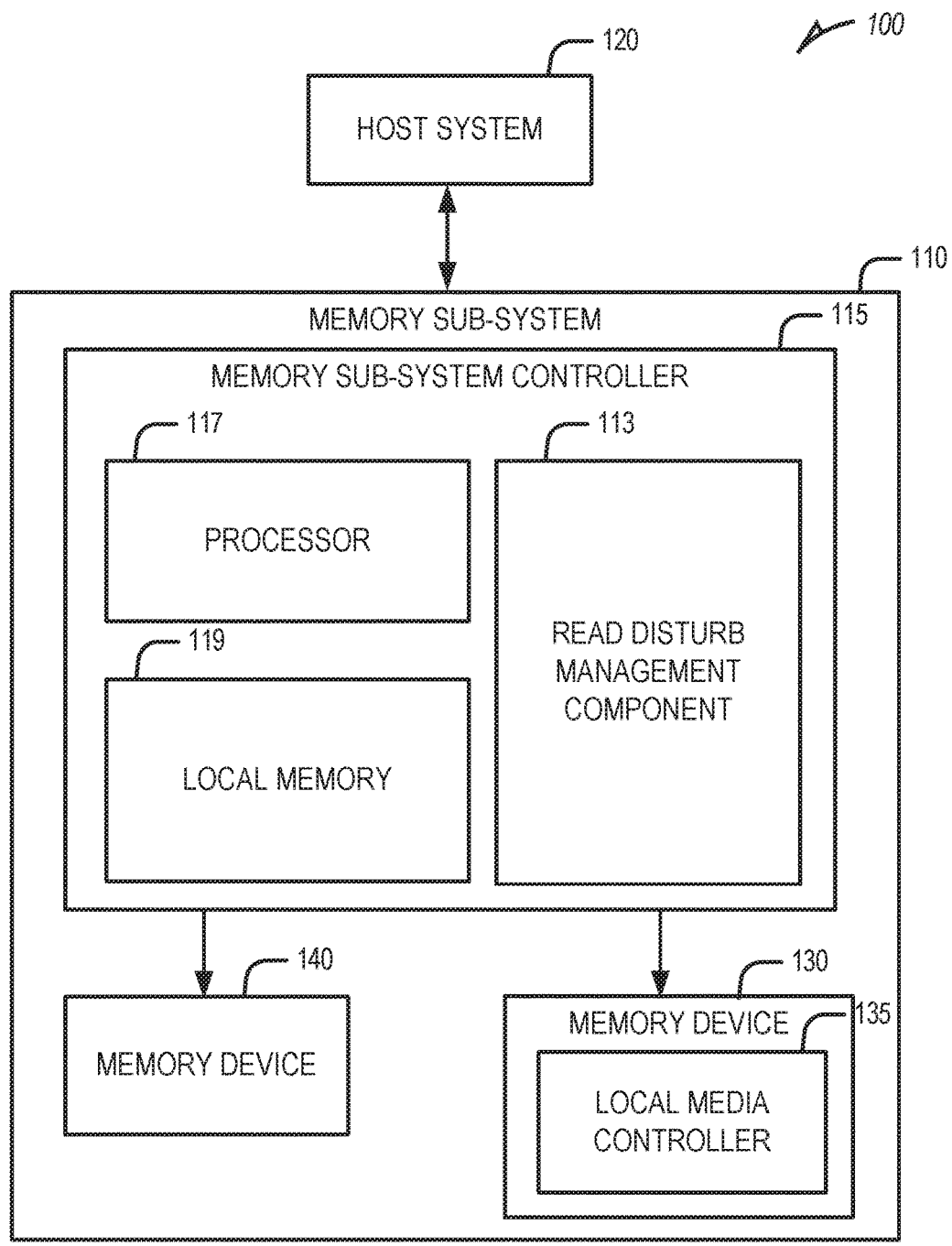
FIG. 1 illustrates an example computing system that includes a memory sub-system, in accordance with some embodiments of the present disclosure.

Aspects of the present disclosure are directed to read-disturb management techniques that include maintaining counters for reads per word line group in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. One example of non-volatile memory devices is a negative-and (NAND) memory device. Other examples of non-volatile memory devices are described below in conjunction with FIG. 1. Data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system.

Some memory devices (e.g., NAND memory devices) include an array of memory cells (e.g., flash cells) to store data. Each cell includes a transistor, and within each cell, data is stored as the threshold voltage of the transistor, based on the logical value of the cell (e.g., 0 or 1). During a read operation, a read reference voltage is applied to the transistor, and if the read reference voltage is higher than the threshold voltage of the cell, the transistor is programmed and is recognized by a memory sub-system as a binary value of 0. Memory cells in these devices can be grouped as pages that can refer to a logical unit of the memory device used to store data. For example, memory cells in NAND memory devices are connected horizontally at their control gates to a word line to form a page. With some types of memory devices (e.g., NAND), pages are grouped to form blocks (also referred to herein as "memory blocks").

There is an inherent limit to the number of times data can be reliably read from a NAND cell. Memory sub-systems often address this inherent limitation through a process of read-disturb handling that often includes copying data to a new location before memory cells reach this limit so that the stored data is not lost. Internally, memory sub-systems attempt to estimate the read limit of cells using read-disturb thresholds. Conventional techniques for read-disturb management rely on per block read counters to track the number of read operations performed per block. Once a block's read counter reaches the read-disturb threshold, the entire block is folded to a new block. That is, data stored by the block that has reached its read-disturb threshold is copied over to a new block. However, blocks can include a large number of cells and are ever increasing in size, and the conventional read-disturb management techniques that rely upon per block read counters and read-disturb thresholds result in many pages of the block being folded long before their inherent limit of read operations is reached. Hence, conventional per block read counters and read-disturb thresholds lead to inefficient utilization of memory device.

Aspects of the present disclosure address issues with conventional read-disturb management techniques by maintain read counters on a per word line group basis. That is, word lines of a memory device are organized into word line groups, and a read-disturb management component of a memory sub-system maintains read counters to track read operations directed to each word line group. The read-disturb management component monitors read operations performed at the memory device and upon detecting a read operation directed at a word line in a particular word line group, the read-disturb management component increments a read counter used to track read operations performed on word lines in the particular word line group.

The read-disturb management component compares the read counter associated with the word line group to an internally maintained read-disturb threshold that can, for example, by specifically associated with the word line group. If the read counter exceeds the read-disturb threshold, the read-disturb management component performs read-disturb handling on the world line group, which can including folding data stored by the word line group to a new location (e.g., a second word line group). Otherwise, the read-disturb management component continues monitoring read operations and maintain per word line group read counters accordingly.

By utilizing read counters that are maintained for each word line group level rather than per block read counters, the read-disturb management component and techniques described in the present application allow for read-disturb handling techniques such as scanning and folding to be performed on a per word line group level rather than a per block level. In doing so, the premature folding of numerous cells within a memory device can be avoided, thereby increasing the efficiency of memory resource utilization.

FIG. 1 illustrates an example computing system 100 that includes a memory sub-system 110, in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., NVDIMM controller), and a storage protocol controller (e.g., peripheral component interconnect express (PCIe) controller, serial advanced technology attachment (SATA) controller). The host system 120 uses the memory sub-system 110, for example, to write data to the memory sub-system 110 and read data from the memory sub-system 110.

The host system 120 can be coupled to the memory sub-system 110 via a host interface. Examples of a host interface include, but are not limited to, a SATA interface, a PCIe interface, USB interface, Fibre Channel, Serial Attached SCSI (SAS), Small Computer System Interface (SCSI), a double data rate (DDR) memory bus, a DIMM interface (e.g., DIMM socket interface that supports Double Data Rate (DDR)), Open NAND Flash Interface (ONFI), Double Data Rate (DDR), Low Power Double Data Rate (LPDDR), or any other interface. The host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional (3D) cross-point memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and 3D NAND.

Each of the memory devices 130 can include one or more arrays of memory cells. One type of memory cell, for example, single level cells (SLC), can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. For example, memory cells in NAND memory devices are connected horizontally at their control gates to a word line to form a page. With some types of memory (e.g., NAND), pages can be grouped to form blocks. Additionally, word lines within a memory device can be organized into multiple word line groups, each of which includes one or more word lines, though each word line group includes fewer word lines than are included in a block.

Although non-volatile memory components such as NAND type flash memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), NOR flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application-specific integrated circuit (ASIC), etc.), or other suitable processor.

The memory sub-system controller 115 can include a processor 117 (processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, and the like. The local memory 119 can also include ROM for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130 and/or the memory device 140. The memory sub-system controller 115 can be responsible for other operations such as wear leveling operations, garbage collection operations, error detection and ECC operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system 120 into command instructions to access the memory devices 130 and/or the memory device 140 and convert responses associated with the memory devices 130 and/or the memory device 140 into information for the host system 120.

In some embodiments, the memory devices 130 include local media controller 135 that operates in conjunction with memory sub-system controller 115 to execute operations on one or more memory cells of the memory devices 130.

The memory sub-system 110 also includes read-disturb management component 113 that is reasonable for read-disturb management processes within the memory sub-system 110. To this end, the read-disturb management component 113 monitors read operations performed on the memory devices 130 and 140 and maintains read counters to track the number of read operations performed on each word line group within the memory devices 130 and 140. The read-disturb management component 113 uses the read counters to determine whether to perform read-disturb handling operations. For example, for a given word line group, the read-disturb management component 113 compares the read counter for the word line group with a read-disturb threshold, and if the read counter exceeds the read-disturb threshold, the read-disturb management component 113 determines whether to fold data stored by the word line group to a new location based, for example, on a residual bit rate error associated with the data. The read-disturb threshold can be a read-disturb threshold that is specific to the word line group or can be a general threshold that is associated with multiple or all word line groups. In this way, the read-disturb management component 113 addresses read-disturb handling on a per word line group basis.

In some embodiments, the memory sub-system controller 115 includes at least a portion of the read-disturb management component 113. For example, the memory sub-system controller 115 can include a processor 117 (processing device) configured to execute instructions stored in local memory 119 for performing the operations described herein. In some embodiments, the read-disturb management component 113 is part of the host system 120, an application, or an operating system. In some embodiments, the local media controller 135 includes at least a portion of the read-disturb management component 113.

Figure 2:
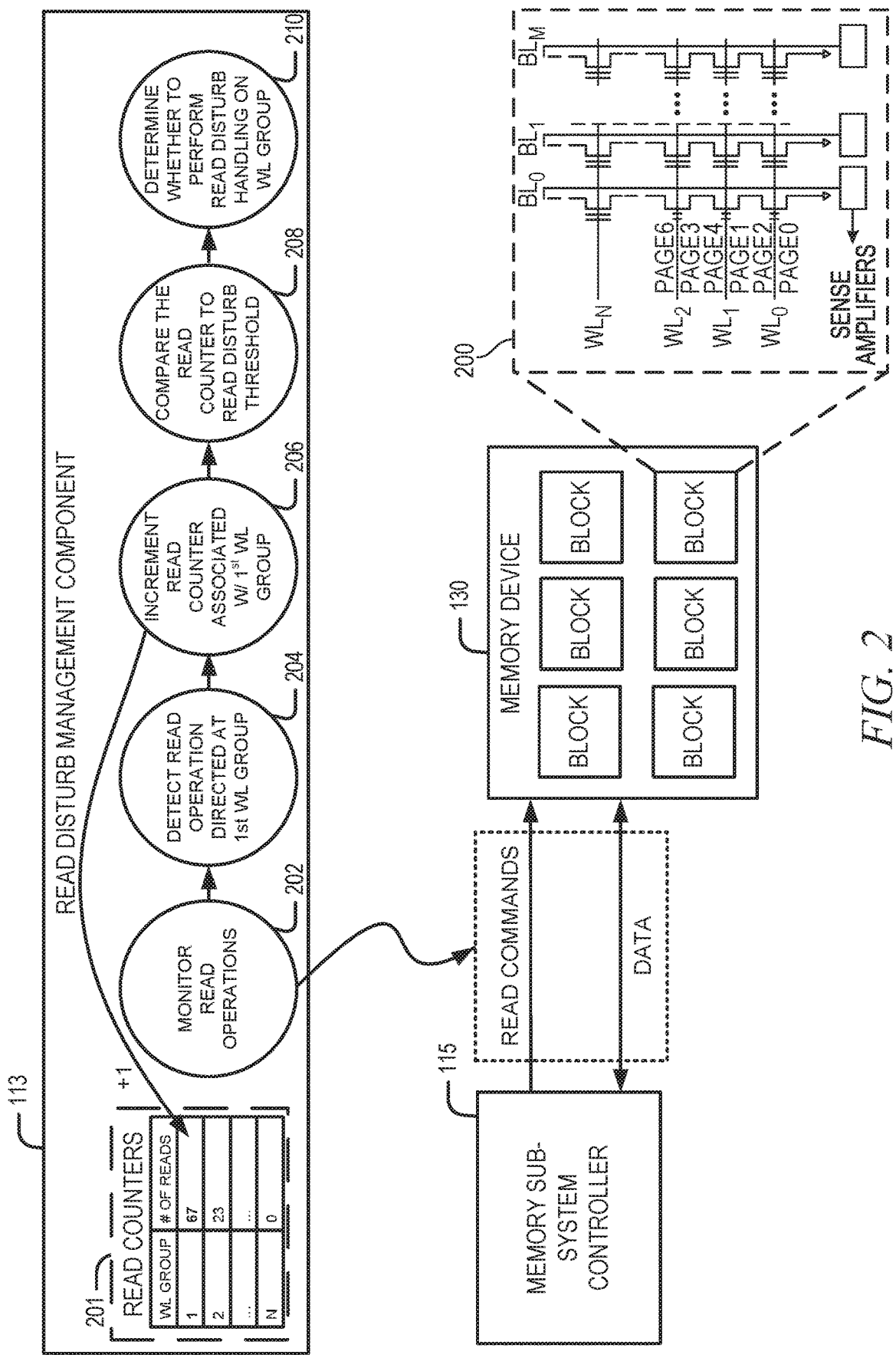
FIG. 2 illustrates interactions between components of the memory sub-system in performing a method of read-disturb management, in accordance with some embodiments of the present disclosure.

FIG. 2 is a data flow diagram illustrating interactions between components of the memory sub-system 110 in performing a method for read-disturb handling, in accordance with some embodiments of the present disclosure. In the example illustrated in FIG. 2, the memory device 130 is a NAND memory device including multiple memory blocks.

As shown, a NAND block 200 includes an array (2D or 3D) of pages (rows) and strings (columns). Each NAND cell includes a transistor, and within each cell, data is stored as the threshold voltage of the transistor, based on the logical value of the cell (e.g., 0 or 1). Strings are connected within the NAND block 200 to allow storage and retrieval of data from selected cells. NAND cells in the same column are connected in series to form a bit line (BL). All cells in a bit line are connected to a common ground on one end and a common sense amplifier on the other for reading the threshold voltage of one of the cells when decoding data. NAND cells are connected horizontally at their control gates to a word line (WL) to form a page. A page is a set of connected cells that share the same word line and is the minimum unit to program.

As discussed above, the word lines within a memory device can be organized into multiple word line groups. Each word line group comprises one or more word lines. The number of word lines in a word line group is less than the total number of word lines in a block. That is, each block includes multiple word line groups. The read-disturb management component 113 can maintain a table or other mapping to identify which word line group each word line belongs to. The read-disturb management component 113 can store this information in local memory (e.g., local memory 119).

The read-disturb management component 113 maintains read counters 201 to track read operations directed at each word line group in the memory device 130. More precisely, the read-disturb management component 113 maintains multiple read counters 201 and each read counter is used to track the number of read operations performed on a particular word line group. In maintaining the multiple read counters, the read-disturb management component 113 stores values corresponding to the read counters in local memory (e.g., local memory 119).

To maintain the read counters, the read-disturb management component 113 monitors read operations performed at the memory device 130 (202). Depending on the embodiment, the read-disturb management component 113 can monitor the read operations by monitoring commands provided by a host system (e.g., host system 120) or a memory sub-system controller (e.g., memory sub-system controller 115) or by monitoring internal logs or tables used to track read operations performed on the memory device 130.

Upon detecting a read operation directed to a first word line group (204), the read-disturb management component 113 increments a first read counter corresponding to the first word line group to indicate that an additional read operation has been performed on the first word line group (206). Similarly, upon detecting a read operation directed to a second word line group, the read-disturb management component 113 increments a second read counter corresponding to the second word line group.

The read-disturb management component 113 identifies the word line to which a read operation is directed based on one or more tables that describe a mapping of read locations (e.g., physical or logical addresses) to word lines and a mapping of word lines to word line groups.

The read-disturb management component 113 compares each read counter to a predetermined read-disturb threshold to determine whether to perform read-disturb handling operations. A read-disturb threshold seeks to estimate the inherent limit on the number of read operations that can be performed on a word line group. Considering word line groups may include different types of NAND cells, the inherent limit may vary between word line groups. Accordingly, the read-disturb management component 113 maintains read-disturb thresholds per word line group so as to allow different read-disturb thresholds to be applied to different word line groups.

As an example, the read-disturb management component 113 compares a first read counter to a first read-disturb threshold associated with the first word line group (208). The read-disturb management component 113 determines whether to perform read-disturb operations (e.g., scanning and folding) on the first word line group based on the comparison (210). If the first read counter does not exceed the first read-disturb threshold, the read-disturb management component 113 continues to monitoring read operations to maintain the read counters.

If the first read counter exceeds the first read-disturb threshold, the read-disturb management component 113 performs read-disturb handling operations on the first word line group. For example, the read-disturb management component 113 scans bits in the data stored by the first word line group to determine a residual bit rate error and determine whether to fold the data to a new location based on the residual bit rate error.

Figure 3:
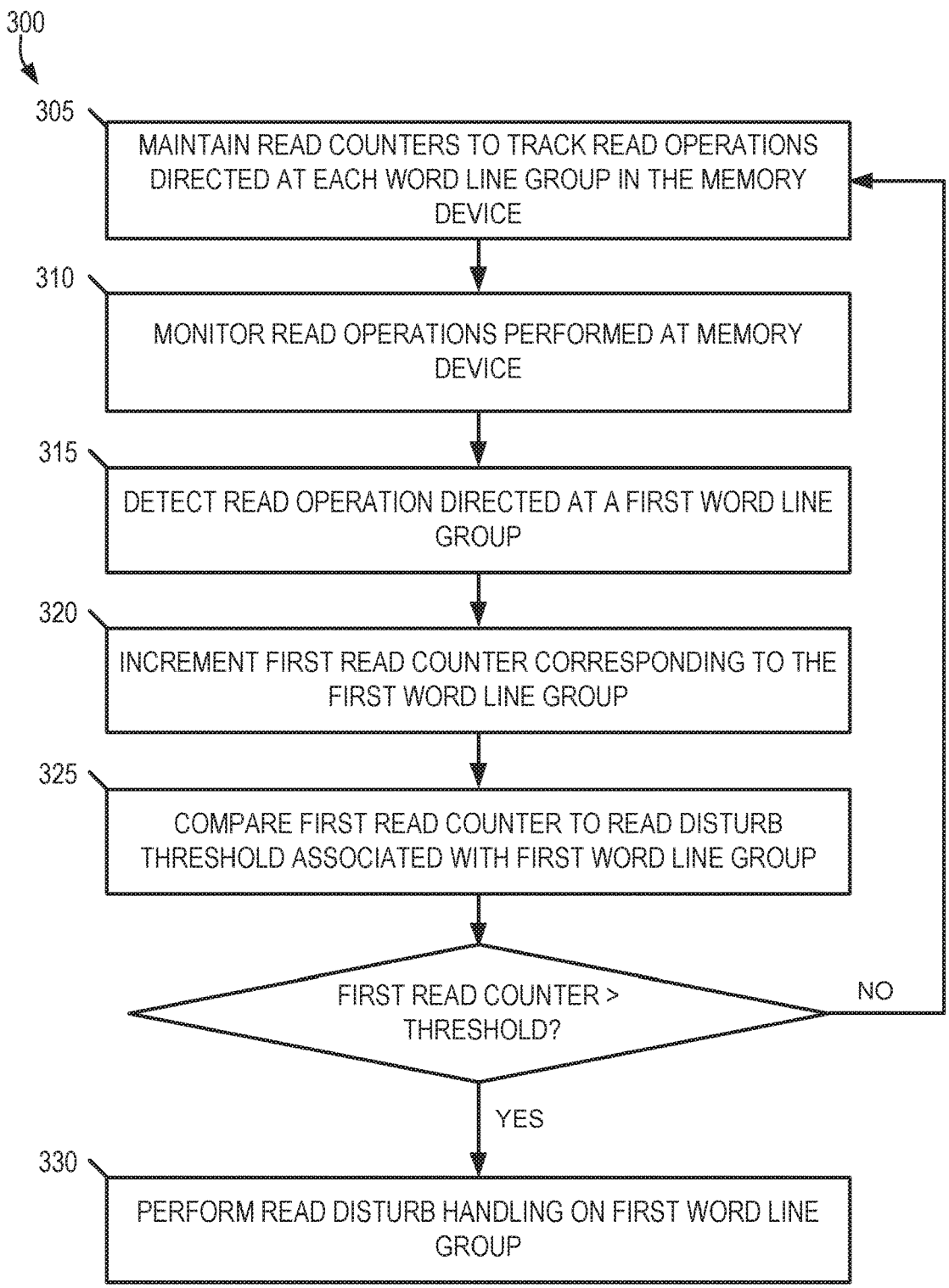
FIGS. 3-5 are flow diagrams illustrating an example method for read-disturb management in a memory sub-system, in accordance with some embodiments of the present disclosure.
Figure 4:
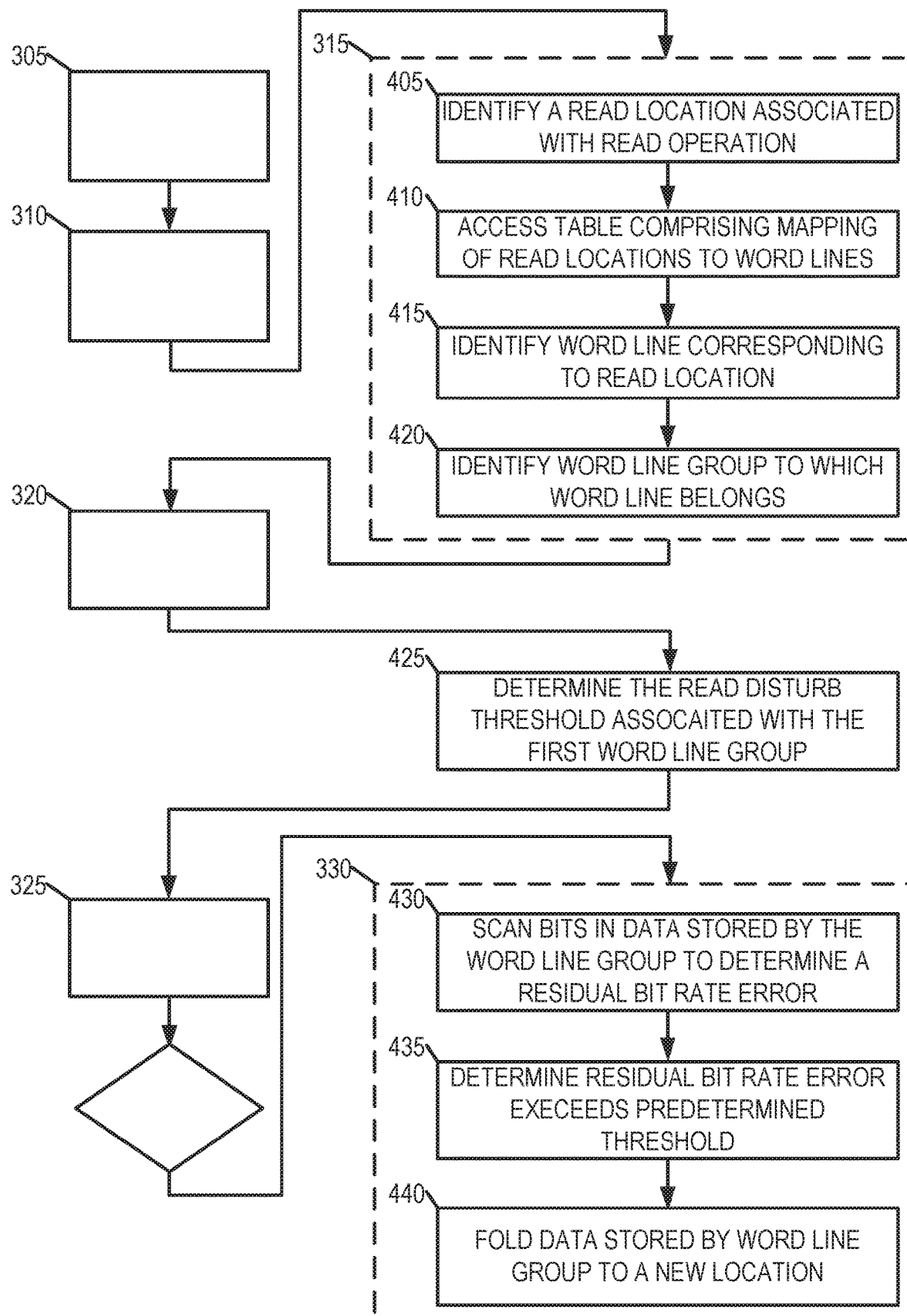
Figure 5:
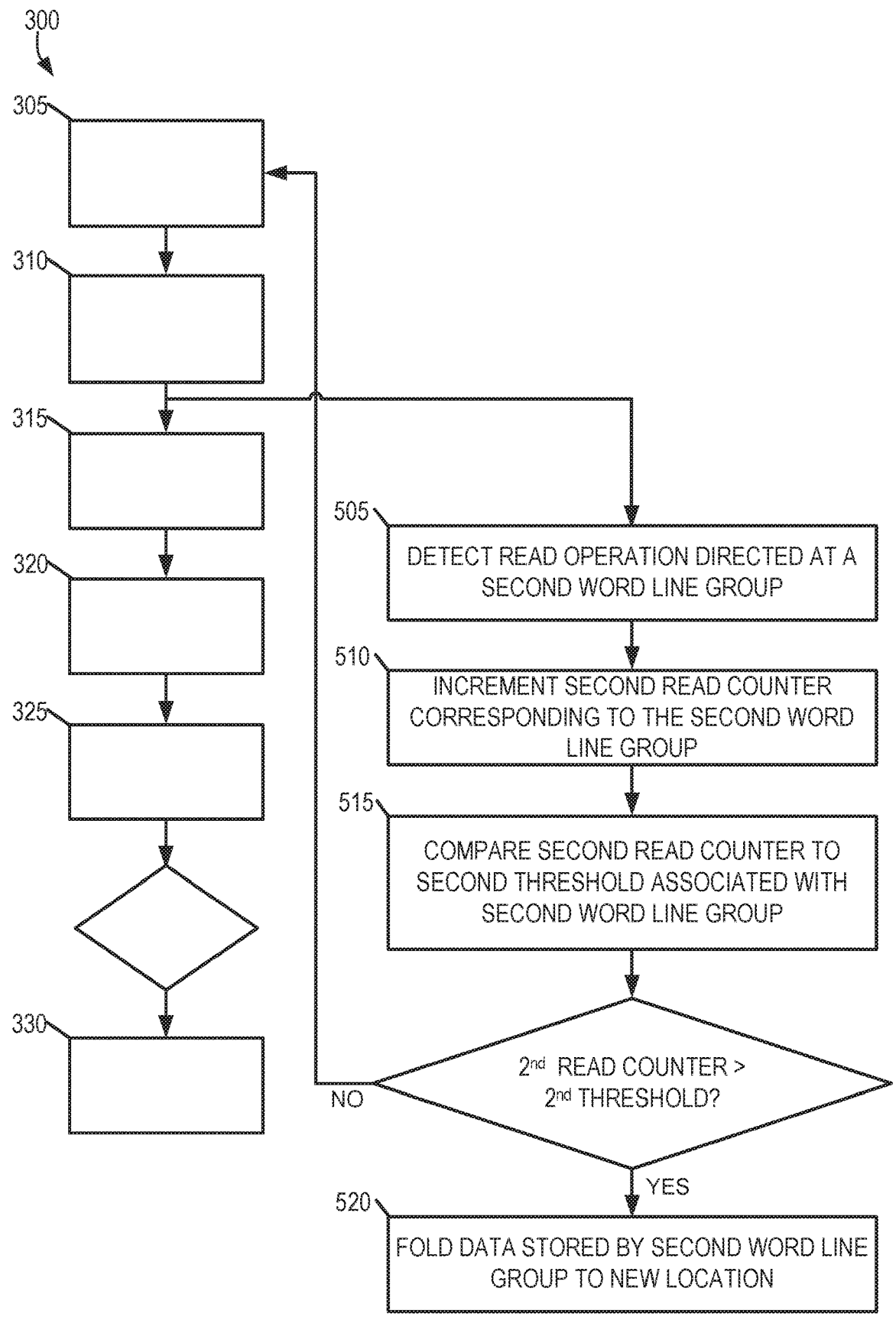

FIGS. 3-5 are flow diagrams illustrating an example method 300 for read-disturb management in a memory sub-system (e.g., the memory sub-system 110) in accordance with some embodiments of the present disclosure. The method 300 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method 300 is performed by the read-disturb management component 113 of FIG. 1. Although processes are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 305, the processing device maintains read counters to track read operations directed at each word line group in the memory device. That is, word lines in the memory device are organized into word line groups, and the processing device maintains a read counter for each word line group to track the number of read operations performed on a per word line group basis. In maintaining a read counter, the processing device stores a value corresponding to the read counter in volatile memory.

At operation 310, the processing device monitors read operations performed at the memory device. Depending on the embodiment, the processing device can monitor the read operations by monitoring commands provided by a host system (e.g., host system 120) or a memory sub-system controller (e.g., memory sub-system controller 115) or by monitoring internal logs or tables used to track read operations performed on the memory device.

At operation 315, the processing device detects a read operation directed to a first word line group. That is, the processing device detects a read operation performed on a word line that is within the first word line group. The processing device can identify the word line to which a read operation is directed based on one or more tables that describe a mapping of read locations (e.g., physical or logical addresses) to word lines and a mapping of word lines to word line groups.

At operation 320, the processing device increments a first read counter corresponding to the first word line group based on the read operation that is directed to the word line group. For example, the processing device can increase a value stored in volatile memory that represents the first read counter to indicate that an additional read operation has been performed with respect to the first word line group.

At operation 325, the processing device compares the first read counter to a predetermined read-disturb threshold. The predetermined read-disturb threshold can be specifically associated with the first word line group or can be associated generally with multiple word line groups.

If the first read counter does not exceed the predetermined threshold, the method 300 returns to operation 305, and the processing device continues to maintain the read counters to track read operations directed at each word line group.

If the first read counter exceeds the predetermined threshold, the processing device performs read-disturb handling operations on the word line group, at operation 330. As will be discussed in more detail below, the read-disturb handling operations include scanning data stored by the word line group to determine a residual bit rate error and determining whether to fold the data to a new location based on the residual bit rate error.

As shown in FIG. 4, the method 300 can, in some embodiments, include operations 405, 410, 415, 420, 425, 430, 435, and 440. As shown, operations 405, 410, 415, and 420 can be performed as part of (e.g., sub-operations or a sub-routine) operation 315, where the processing device detects a write operation directed to a first word line group in the memory device.

At operation 405, the processing device identifies a read location associated with a read operation. The read location can correspond to a logical or physical page address included in a command or log used to track write operations at the memory device.

At operation 410, the processing device accesses a table comprising a mapping of read locations to word lines. The table can be stored in volatile memory operatively coupled to the processing device (e.g., a DRAM of the processing device). The processing device, at operation 415, identifies a word line in the memory device corresponding to the read location based on the mapping in the table.

At operation 420, the processing device identifies a word line group to which the word line belongs. The processing device identifies the word line group to which the word line belongs based on an internally maintained mapping of word lines to word line groups. The mapping can be included in the table that includes the mapping of read location to word lines or can be included in a second table. As with the mapping of the read locations to word lines, the mapping of word lines to word line groups can be stored in volatile memory operatively coupled to the processing device (e.g., a DRAM of the processing device).

As shown, the operation 425 can be performed prior to operation 325, where the processing device compares the first read counter to the predetermined read-disturb threshold. At operation 425, the processing device determines the predetermined read-disturb threshold associated with the first read counter. As noted above, a separate read-disturb threshold can be maintained for each word line group such that the first word line group may not share the same read-disturb threshold as a second word line group. To this end, the processing device can maintain and store read-disturb thresholds in volatile memory. The read-disturb thresholds can be maintained in a distinct table that maps word line groups to read-disturb threshold or can be incorporated into a table that includes one or more of the mappings referenced above.

As shown, the operations 430, 435, and 440 can be performed as part of operation 330 where the processing device performs read-disturb handling operations on the first word line group. At operation 430, the processing device scans bits of data stored by the first word line group to determine a residual bit error rate, and at operation 435, the processing device determines the residual bit error rate exceeds a predetermined threshold for residual bit error rate.

At operation 440, the processing device folds data stored by the first word line group to a new location within the memory device based on determining the residual bit error rate exceeds the predetermined threshold for residual bit error rate. That is, the processing device copies the data to the new location. The new location can, for example, correspond to one or more word lines in a second word line group. The second word line group can be within the same block as the first word line group or within a different block.

As shown in FIG. 5, the method 300 can, in some embodiments, include operations 505, 510, 515, and 520. The operations 505, 510, 515, and 520 can, for example, be performed prior to, subsequent to, or in parallel with any one or more of operations 315, 320, 325, and 330.

At operation 505, the processing device detects a read operation directed at a second word line group in the memory device. That is, the processing device detects a read operation directed at a word line within the second word line group. The processing device increments a second read counter corresponding to the second word line group, at operation 510. The processing device, at operation 515, compares the second read counter to a second read-disturb threshold specifically associated with the second word line group. The second read-disturb threshold is different than the read-disturb threshold to which the first read counter is compared at operation 325.

If the second read counter does not exceed the second read-disturb threshold, the method 300 returns to operation 305, and the processing device continues to maintain the read counters to track read operations directed at each word line group.

If the second read counter exceeds the second read-disturb threshold, the processing device performs read-disturb handling operations on the second word line group, which includes scanning bits stored by the second word line group to determine whether to fold data stored by the second word line group to a new location.

EXAMPLES

Example 1 is a memory sub-system comprising: a memory device organized into multiple word line groups; and a processing device, operatively coupled with the memory device, to perform operations comprising: detecting a read operation directed at a word line group from among the multiple word line groups of the memory device, the word line group comprising one or more word lines; incrementing a read counter associated with the word line group based on the read operation being directed at the word line group; determining the read counter exceeds a read-disturb threshold; and in response to determining the read counter exceeds the read-disturb threshold, performing read-disturb handling on the word line group.

Example 2 includes the memory sub-system of claim 1, wherein the performing of the read-disturb handling on the word line group comprises folding data stored by the word line group to a new location.

Example 3 includes the memory sub-system of any one of claims 1 and 2, wherein: the performing of the read-disturb handling further comprises: scanning bits in the data stored by the word line group to determine a residual bit rate error, and determining the residual bit rate error exceeds a threshold residual bit rate error, and the folding of the data stored by the word line group is in response to determining the residual bit rate error exceeds the threshold residual bit rate error.

Example 4 includes the memory sub-system of any one of claims 1-3, wherein: the word line group is a first word line group; and the folding of the data stored by the word line group comprises folding data to a second word line group.

Example 5 includes the memory sub-system of any one of claims 1-4, wherein the operations further comprise: identifying a read location within the memory device associated with the read operation; identifying a word line in the memory device corresponding to the read location; and determining the word line belongs to the word line group.

Example 6 includes the memory sub-system of any one of claims 1-5, wherein identifying the word line in the memory device corresponding to the read location comprises: accessing, from local memory, a mapping of read locations to word lines in the memory device; and determining the read location corresponds to the word line based on the mapping.

Example 7 includes the memory sub-system of any one of claims 1-6, wherein: the read counter is a first read counter associated with a first word line group; and the operations further comprise maintaining a second read counter associated with a second word line group.

Example 8 includes the memory sub-system of any one of claims 1-7, wherein: the word line group is a first word line group; the read operation is a first read operation; and the operations further comprise incrementing the second read counter based on a second read operation directed at the second word line group.

Example 9 includes the memory sub-system of any one of examples 1-8, wherein the default read level associated with the last written page is based on a page type of the last written page.

Example 10 is a method comprising: detecting an asynchronous power loss event at a memory device comprising at least one memory block, the at least one block comprising multiple pages; in response to detecting the asynchronous power loss event, identifying a last written page from among the multiple pages; determining a count of zeroes programmed in the last written page; and determining whether to perform a dummy write operation at the last written page based on the count of zeroes programmed in the last written page.

Example 11 includes the method of example 10, further comprising: identifying a read location within the memory device to which the read operation is directed; identifying a word line in the memory device corresponding to the read location; and identifying the word line group to which the word line belongs.

Example 12 includes the method of any one of examples 10-11, wherein identifying the word line in the memory device corresponding to the read location comprises: accessing, from local memory, a mapping of read locations to word lines in the memory device; and determining the read location corresponds to the word line based on the mapping.

Example 13 includes the method of any one of examples 10-12, wherein the performing of the read-disturb handling on the word line group comprises folding data stored by the word line group to a new location.

Example 14 includes the method of any one of examples 10-13, wherein: the performing of the read-disturb handling further comprises: scanning bits in the data stored by the word line group to determine a residual bit rate error; and determining the residual bit rate error exceeds a threshold residual bit rate error, and the folding of the data stored by the word line group is in response to determining the residual bit rate error exceeds the threshold residual bit rate error.

Example 15 includes the method of any one of examples 10-14, further comprising: determining the read-disturb threshold associated with the word line group.

Example 16 includes the method of any one of examples 10-15, wherein: the read counter is a first read counter associated with a first word line group; and the operations further comprise maintaining a second read counter associated with a second word line group.

Example 17 includes the method of any one of examples 10-16, wherein: the word line group is a first word line group; the read operation is a first read operation; and the operations further comprise incrementing the second read counter based on a second read operation directed at a second word line group.

Example 18 includes the method of any one of examples 10-17, wherein: the read-disturb threshold is a first read-disturb threshold associated with the first word line group; the operations further comprise comparing the second read counter with a second read-disturb threshold to determine whether to perform read-disturb handling on the second word line group; and the second read-disturb threshold is different than the first read-disturb threshold.

Example 19 is a computer-readable storage medium comprising instructions that, when executed by a processing device, configure the processing device to perform operations comprising: monitoring read operations performed on a memory device organized into multiple word line groups; detecting a read operation directed to a word line group from the multiple word line groups; incrementing a read counter associated with the word line group in response to detecting the read operation directed at the word line group; determining the read counter exceeds a read-disturb threshold; and in response to determining the read counter exceeds the read-disturb threshold, folding data stored by the word line group to a new location.

Example 20 includes the computer-readable storage medium of example 18, wherein: the read counter is a first read counter associated with a first word line group; the word line group is a first word line group; the read operation is a first read operation; the read-disturb threshold is a first read-disturb threshold associated with the first word line group; and the operations further comprise: maintaining a second read counter associated with a second word line group; incrementing the second read counter based on a second read operation directed at a second word line group; and comparing the second read counter with a second read-disturb threshold to determine whether to perform read-disturb handling on the second word line group.

Figure 6:
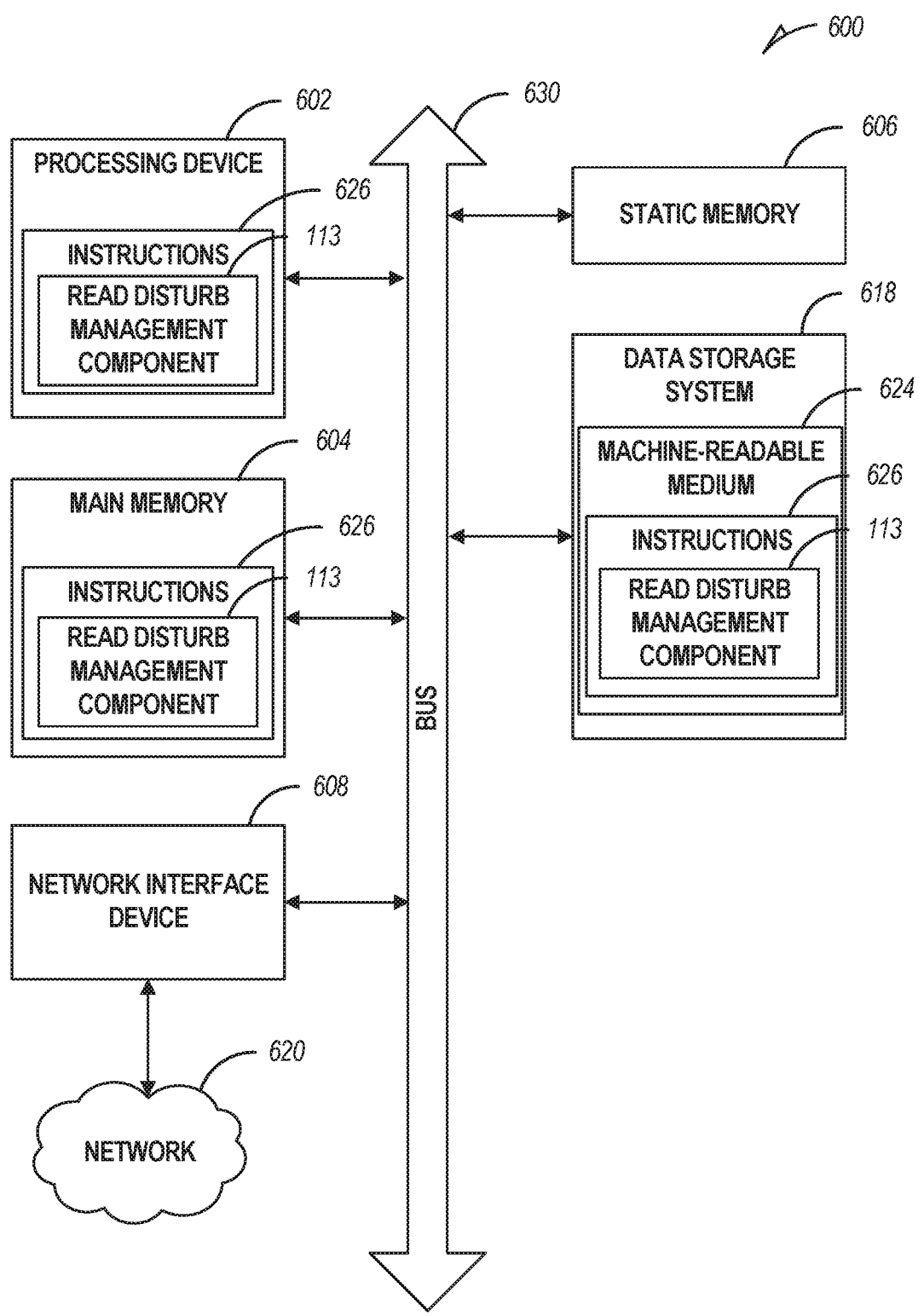
FIG. 6 is a block diagram of an example computer system in which embodiments of the present disclosure may operate.

FIG. 6 illustrates an example machine in the form of a computer system 600 within which a set of instructions can be executed for causing the machine to perform any one or more of the methodologies discussed herein. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the read-disturb management component 113 of FIG. 1). In alternative embodiments, the machine can be connected (e.g., networked) to other machines in a local area network (LAN), an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., ROM, flash memory. DRAM such as SDRAM or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device 602 can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an ASIC, a FPGA, a digital signal processor (DSP), network processor, or the like. The processing device 602 is configured to execute instructions 626 for performing the operations and steps discussed herein. The computer system 600 can further include a network interface device 608 to communicate over a network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a data destruction component (e.g., the read-disturb management component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer-readable storage medium, such as, but not limited to, any type of disk including floppy disks, optical disks. CD-ROMs, and magnetic-optical disks, ROMs, RAMs, EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a ROM, RAM, magnetic disk storage media, optical storage media, flash memory components, and so forth.

In the foregoing specification, embodiments of the disclosure have been described with reference to specific example embodiments thereof. It will be evident that various modifications can be made thereto without departing from the broader scope of embodiments of the disclosure as set forth in the following claims. The specification and drawings are, accordingly, to be regarded in an illustrative sense rather than a restrictive sense.

What is claimed is:

1. A system comprising:
  a memory device organized into multiple word line groups; and
  a processing device, operatively coupled with the memory device, to perform operations comprising:
    detecting a read operation directed at a word line group from among the multiple word line groups of the memory device, the word line group comprising one or more word lines;
    incrementing a read counter associated with the word line group based on the read operation being directed at the word line group;
    determining the read counter exceeds a read-disturb threshold; and
    in response to determining the read counter exceeds the read-disturb threshold, performing read-disturb handling on the word line group, the performing of the read-disturb handling comprising:
      scanning bits in data stored by the word line group to determine a residual bit rate error; and
      determining the residual bit rate error exceeds a threshold residual bit rate error; and
      in response to determining the residual bit rate error exceeds the threshold residual bit rate error, folding the data stored by the word line group to a new location.

2. The system of claim 1, wherein:
the word line group is a first word line group; and
the folding of the data stored by the word line group comprises folding data to a second word line group.

3. The system of claim 1, wherein the operations further comprise:
identifying a read location within the memory device associated with the read operation;
identifying a word line in the memory device corresponding to the read location; and
determining the word line belongs to the word line group.

4. The system of claim 3, wherein identifying the word line in the memory device corresponding to the read location comprises:
accessing, from local memory, a mapping of read locations to word lines in the memory device; and
determining the read location corresponds to the word line based on the mapping.

5. The system of claim 1, wherein:
the read counter is a first read counter associated with a first word line group; and
the operations further comprise maintaining a second read counter associated with a second word line group.

6. The system of claim 5, wherein:
the word line group is a first word line group;
the read operation is a first read operation; and
the operations further comprise incrementing the second read counter based on a second read operation directed at the second word line group.

7. The system of claim 5, wherein:
the read-disturb threshold is a first read-disturb threshold associated with the first word line group;
the operations further comprise comparing the second read counter with a second read-disturb threshold to determine whether to perform read-disturb handling on the second word line group; and
the second read-disturb threshold is different than the first read-disturb threshold.

8. A method comprising:
monitoring read operations performed on a memory device organized into multiple word line groups, each word line group comprising one or more word lines;
maintaining read counters to track read operations directed at each word line group within the memory device;
incrementing a read counter in response to detecting a read operation directed at a particular word line group;
determining the read counter exceeds a read-disturb threshold; and
in response to determining the read counter exceeds the read-disturb threshold, performing read-disturb handling on the word line group, the performing of the read-disturb handling comprising:
scanning bits in data stored by the word line group to determine a residual bit rate error; and
determining the residual bit rate error exceeds a threshold residual bit rate error; and
in response to determining the residual bit rate error exceeds the threshold residual bit rate error, folding the data stored by the word line group to a new location.

9. The method of claim 8, further comprising:
identifying a read location within the memory device to which the read operation is directed;
identifying a word line in the memory device corresponding to the read location; and
identifying the word line group to which the word line belongs.

10. The method of claim 9, wherein identifying the word line in the memory device corresponding to the read location comprises:
accessing, from local memory, a mapping of read locations to word lines in the memory device; and
determining the read location corresponds to the word line based on the mapping.

11. The method of claim 8, further comprising:
determining the read-disturb threshold associated with the word line group.

12. The method of claim 8, wherein:
the read counter is a first read counter associated with a first word line group; and
the operations further comprise maintaining a second read counter associated with a second word line group.

13. The method of claim 12, wherein:
the word line group is a first word line group;
the read operation is a first read operation; and
the operations further comprise incrementing the second read counter based on a second read operation directed at a second word line group.

14. The method of claim 13, wherein:
the read-disturb threshold is a first read-disturb threshold associated with the first word line group;
the operations further comprise comparing the second read counter with a second read-disturb threshold to determine whether to perform read-disturb handling on the second word line group; and
the second read-disturb threshold is different than the first read-disturb threshold.

15. A non-transitory computer-readable storage medium comprising instructions that, when executed by a processing device, configure the processing device to perform operations comprising:
monitoring read operations performed on a memory device organized into multiple word line groups;
detecting a read operation directed to a word line group from the multiple word line groups;
incrementing a read counter associated with the word line group in response to detecting the read operation directed at the word line group;
determining the read counter exceeds a read-disturb threshold; and
in response to determining the read counter exceeds the read-disturb threshold, performing read-disturb handling on the word line group, the performing of the read-disturb handling comprising:
scanning bits in data stored by the word line group to determine a residual bit rate error; and
determining the residual bit rate error exceeds a threshold residual bit rate error; and
in response to determining the residual bit rate error exceeds the threshold residual bit rate error, folding the data stored by the word line group to a new location.

16. The non-transitory computer-readable storage medium of claim 15, wherein:
the read counter is a first read counter associated with a first word line group;
the word line group is a first word line group;
the read operation is a first read operation;
the read-disturb threshold is a first read-disturb threshold associated with the first word line group; and
the operations further comprise:
maintaining a second read counter associated with a second word line group;

incrementing the second read counter based on a second read operation directed at a second word line group; and comparing the second read counter with a second read-disturb threshold to determine whether to perform read-disturb handling on the second word line group.

17. The non-transitory computer-readable storage medium of claim 15, wherein:

the word line group is a first word line group; and the folding of the data stored by the word line group comprises folding data to a second word line group.

18. The non-transitory computer-readable storage medium of claim 15, wherein the operations further comprise:

identifying a read location within the memory device associated with the read operation;

identifying a word line in the memory device corresponding to the read location; and determining the word line belongs to the word line group.

19. The non-transitory computer-readable storage medium of claim 18, wherein identifying the word line in the memory device corresponding to the read location comprises:

accessing, from local memory, a mapping of read locations to word lines in the memory device; and determining the read location corresponds to the word line based on the mapping.

20. The non-transitory computer-readable storage medium of claim 15, wherein the operations further comprise determining the read-disturb threshold associated with the word line group.

* * * * *